(12) United States Patent  
Kutsukake

(10) Patent No.: US 9,190,154 B2  
(45) Date of Patent: Nov. 17, 2015

(54) NONVOLATILE SEMICONDUCTOR MEMORY DEVICE

(71) Applicant: Kabushiki Kaisha Toshiba, Minato-ku (JP)

(72) Inventor: Hiroyuki Kutsukake, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/462,831

(22) Filed: Aug. 19, 2014

(65) Prior Publication Data

US 2015/0262684 A1 Sep. 17, 2015

Related U.S. Application Data

(60) Provisional application No. 61/951,438, filed on Mar. 11, 2014.

(51) Int. Cl.
*G11C 16/12* (2006.01)
*G11C 16/04* (2006.01)

(52) U.S. Cl.
CPC ............ *G11C 16/12* (2013.01); *G11C 16/0483* (2013.01)

(58) Field of Classification Search
CPC .............. G11C 16/12; H01L 27/11558; H01L 29/4916
See application file for complete search history.

(56) References Cited

U.S. PATENT DOCUMENTS 8,686,488 B2 4/2014 Kondo et al.

FOREIGN PATENT DOCUMENTS

| JP | 2012-69822 | 4/2012 |
| JP | 2013-110436 | 6/2013 |
| JP | 2013-115329 | 6/2013 |

*Primary Examiner* — Harry W Byrne
*Assistant Examiner* — Lance Reidlinger
(74) *Attorney, Agent, or Firm* — Oblon, McClelland, Maier & Neustadt, L.L.P.

(57) ABSTRACT

The voltage switching circuit comprises: an nMOS transistor having a gate connected to a first terminal that outputs an output voltage, a drain connected to a power-supply terminal, and a source connected to a second terminal; a first pMOS transistor having a source connected to the second terminal, a drain connected to the first terminal, and a gate provided with a first or second voltage, a source and a well thereof being short-circuited; and a switching circuit connected between a third terminal that supplies the input voltage and the first terminal and configured to turn on when the output voltage is supplied to the first terminal. A gate electrode of the first pMOS transistor is configured by semiconductor including p-type impurity. A concentration of p-type impurity in the gate electrode of the memory cell is different from that of the first pMOS transistor.

9 Claims, 8 Drawing Sheets

RELIEVES ELECTRIC FIELD OF
THE GATE INSULATING FILM

NONVOLATILE SEMICONDUCTOR MEMORY DEVICE

CROSS REFERENCE TO RELATED APPLICATIONS

This application is based on and claims the benefit of priority from prior U.S. prior provisional Patent Application No. 61/951,438, filed on Mar. 11, 2014, the entire contents of which are incorporated herein by reference.

FIELD

Embodiments described herein relate to a nonvolatile semiconductor memory device.

BACKGROUND

A nonvolatile semiconductor memory device, for example, a NAND type flash memory is configured to be supplied with various kinds of voltages to its wiring lines connected to memory cells in a memory cell array. When a voltage supplied thereto is high, a high voltage is applied to a transistor included in a voltage supplying circuit, and then stress applied to a gate insulating film becomes large.

DETAILED DESCRIPTION

A nonvolatile semiconductor memory device according to the embodiments described herein comprises: a memory cell array having memory cells arranged therein; a row decoder circuit that selects a word line in the memory cell array, and transfers a voltage to the word line; and a voltage switching circuit that generates an output voltage in response to input of an input voltage, and changes a value of an output voltage depending on a value of a power supply voltage to supply the output voltage to the row decoder.

The voltage switching circuit comprises: an n type MOS transistor having a gate connected to a first terminal that outputs the output voltage, a drain connected to a power supply terminal that outputs the power supply voltage, and a source connected to a second terminal; a first p type MOS transistor having a source connected to the second terminal, a drain connected to the first terminal, and a gate provided with a first voltage or a second voltage, a source and a well thereof being short-circuited; and a switching circuit connected between a third terminal that supplies the input voltage and the first terminal and configured to turn on when the output voltage is supplied to the first terminal. A gate electrode of the first p type MOS transistor is configured by semiconductor including p type impurity. A concentration of p type impurity in the gate electrode of the memory cell is different from a concentration of p type impurity in the gate electrode of the first p type MOS transistor.

Hereinbelow, embodiments will be explained in detail with reference to drawings.

Figure 1:
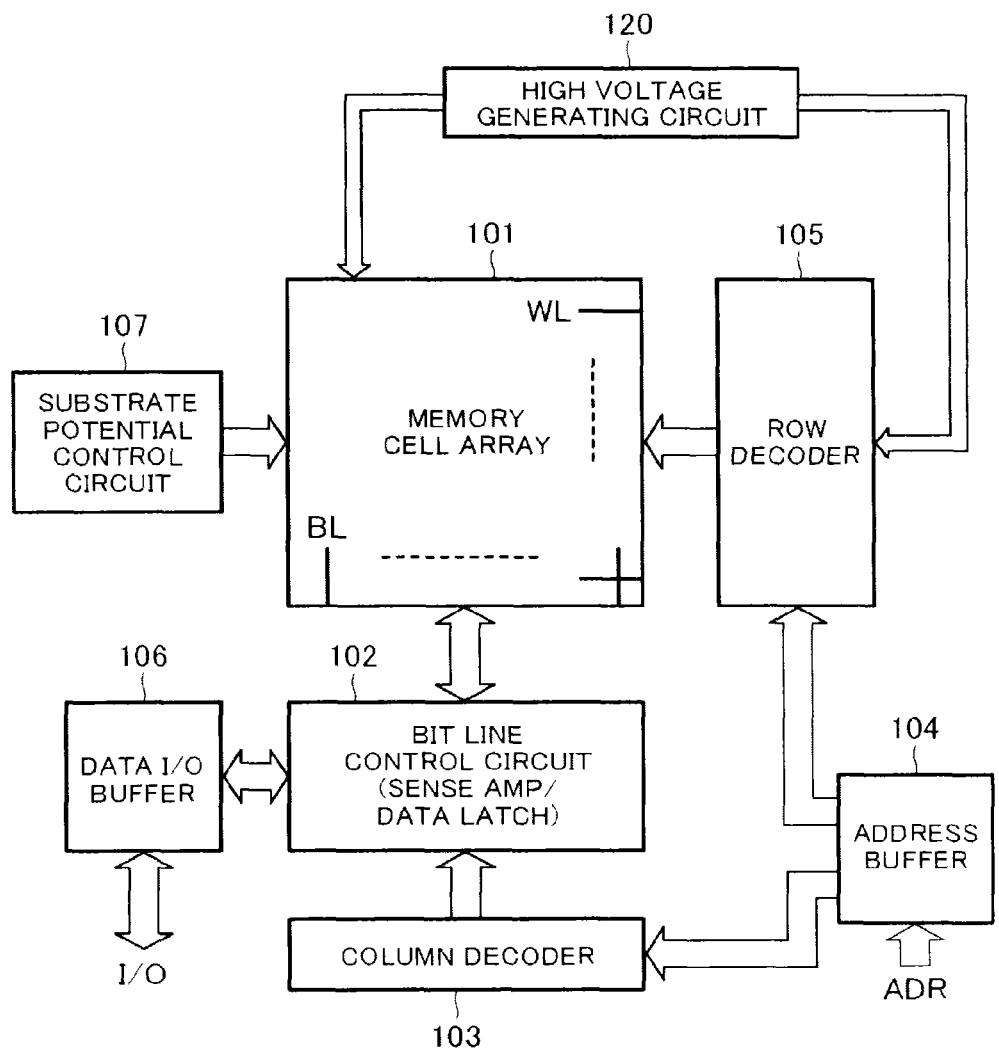
FIG. 1 is a block diagram showing a schematic configuration of a NAND type flash memory according to an embodiment.

FIG. 1 is a block diagram illustrating a schematic structure of a NAND type flash memory according to the embodiment.

A memory cell array 101 is configured by arranging memory cells M therein. Specifically, it is configured by arranging NAND cells in which a plurality of memory cells M are connected in series. Also, in this memory cell array 101, bit lines BL and word lines WL are formed as wiring lines connected to these NAND cells.

A bit line control circuit 102 (sense amplifier/data latch) for performing data write, read, rewrite and verify read is provided for the memory cell array 101. This bit line control circuit 102 is connected to a data input/output buffer 106. The bit line control circuit 102 receives data through the data input/output buffer 106 from external, and outputs data through the data input/output buffer 106 to external. In addition, the bit line control circuit 102 receives address signals ADR from an address buffer 104 through a column decoder 103.

Also, provided for the memory cell array 101 are a row decoder 105 for controlling a control gate and a selection gate, and a substrate potential control circuit 107 for controlling an electric potential of a p type silicon substrate (or p type well region) in which the memory cell array 101 is formed.

In addition, a voltage generating circuit 120 is provided as a circuit that generates various kinds of voltages supplied to memory cells included in the memory cell array 101.

The bit line control circuit 102 controls operation such as the data latch for writing, a sensing operation for reading a potential of the bit line, a sensing operation for verify read after the writing, and latch of rewritten data.

Figure 2A:
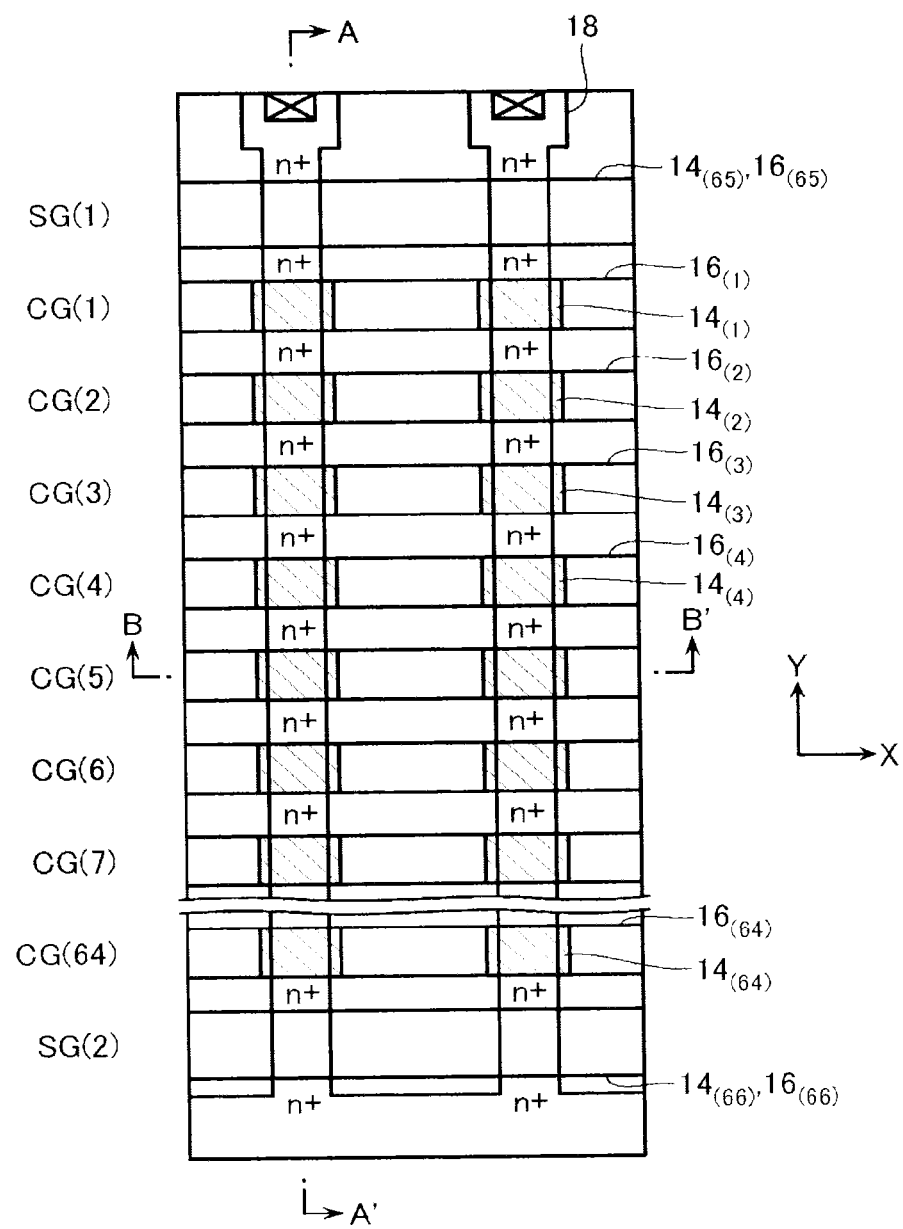
FIG. 2A is a plan view of one NAND cell part in the memory cell array 101.
Figure 2B:
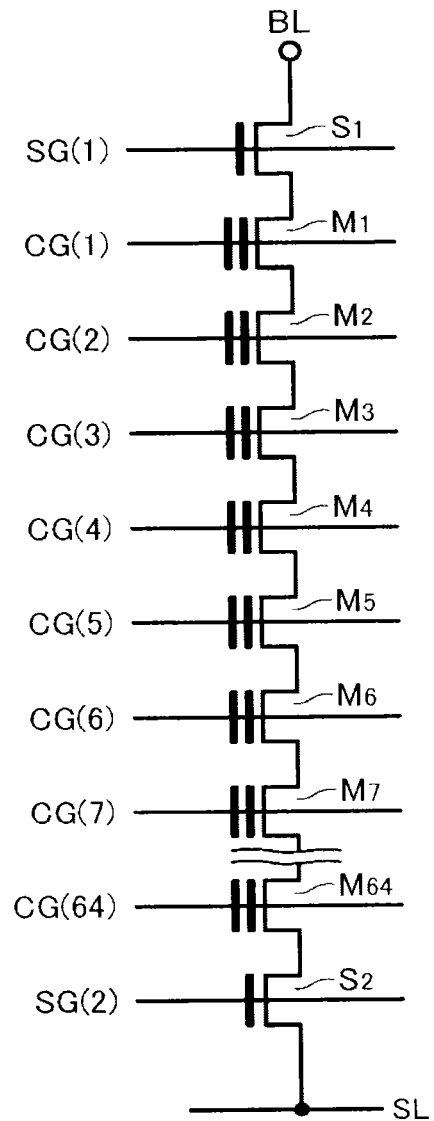
FIG. 2B is a plan view of one NAND cell part in the memory cell array 101.
Figure 3A:
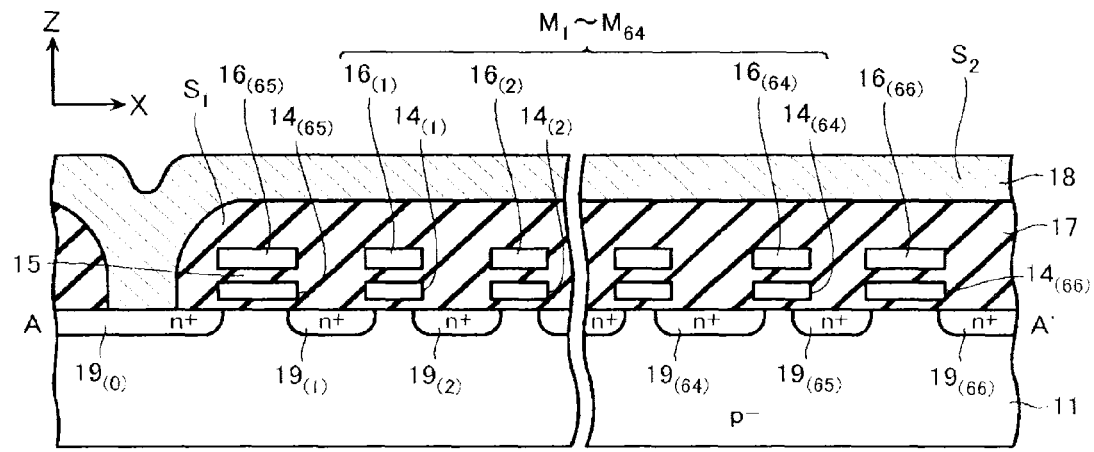
FIGS. 3A and 3B are A-A' cross sectional view of FIG. 2A and B-B' cross sectional view thereof, respectively.
Figure 3B:
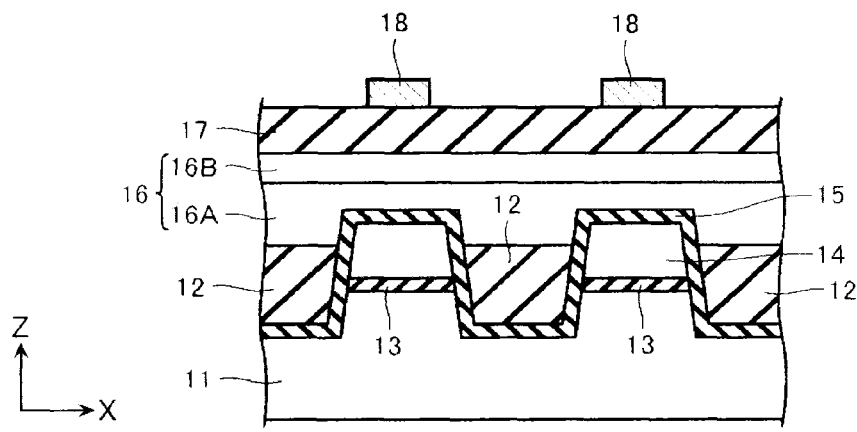

FIG. 2A and FIG. 2B are a plan view and an equivalent circuit diagram of one NAND cell in the memory cell array 101, respectively. FIG. 3A and FIG. 3B are an A-A' cross sectional view of FIG. 2A and a B-B' cross sectional view thereof, respectively.

As shown in FIG. 2A, this memory cell array 101 comprises control gate lines CG(1) to CG(64) and conductive layers 18 arranged to intersect the control gate lines CG(1) to CG(64). The control gate lines CG(1)..., CG(64) function as word lines WL formed in X direction as its lengthwise direction. On the other hand, the conductive layers 18 have a lengthwise direction along Y direction, and function as the bit lines BL. The memory cells M are respectively formed at intersections of the control gate lines CG and the conductive layers 18 (bit line BL). One NAND cell is formed by series-connecting, for example 64 memory cells M, as shown in FIG. 2B. A drain side select transistor S1 is connected to one end of the NAND cell. The bit line BL is connected to another end of this drain side select transistor S1. Also, a source side select transistor S2 is connected to another end of the NAND cell. A source line SL is connected to another end of this source side select transistor S2. Furthermore, a drain side selection gate line SG(1) is connected to a gate of the drain side select transistor S1, and a source side selection gate line SG(2) is connected to a gate of the source side select transistor S2.

As shown in FIG. 3A and FIG. 3B, the memory cells $M_1$ to $M_{64}$ in one NAND cell each comprise a floating gate 14 ($14_{(1)}$, $14_{(2)}$, ..., $14_{(64)}$) which is formed on the substrate 11 through a gate insulating film 13, respectively. The control gates 16 ($16_{(1)}$, $16_{(2)}$, ..., $16_{(64)}$) are each formed on the floating gate 14 via an inter-gate insulating film 15. The control gates 16 extend in a direction perpendicular to the paper plane of FIG. 3A as its lengthwise direction, and function as the above-mentioned control gate lines CG(1)...(64) and the word lines WL.

N type diffusion layers 19 ($19_{(1)}$, $19_{(2)}$ ..., $19_{(65)}$) as sources and drains of the memory cells M are shared by two of the memory cells M or the select transistors S1, S2 which are adjacent to each other. Note that the drain side select transistor S1 and the source side select transistor S2 also comprise the floating gates 14 ($14_{(65)}$, $14_{(66)}$) and the control gates 16 ($16_{(65)}$, $16_{(66)}$) in a similar manner. However, the floating gate 14 and the control gate 16 in the drain side select transistor S1 and the source side select transistor S2 are short-circuited via a through-hole formed at a position not illustrated to constitute a single gate electrode. Also, n type diffusion layer $19_{(0)}$ comprising a drain of the drain side select transistor S1 is connected to the bit line BL. Also, although illustration thereof is omitted, the n type diffusion layer $19_{(66)}$ that constitutes a source of the source side select transistor S2 is connected to a source line SL via a via-wiring line not illustrated.

It is noted that, as shown in FIG. 3B, the control gate 16 may be formed by a two-layer structure of a first wiring layer 16A formed of polysilicon, for example, and a silicide layers 16B formed on the upper layer of the first wiring layer 16A. On this control gate layer 16, the conductive layer 18 is formed so as to extend in the Y direction as its lengthwise direction through an interlayer insulating film 17.

In addition, as shown in FIG. 3B, the element isolation insulating film 12 is formed in the p type silicon substrate 11, arranged in the X direction at a certain interval. The element isolation insulating film 12 extends in the Y direction as its lengthwise direction, and divides the p type silicon substrate 11 into plural semiconductor formation areas (active areas). An NAND cell is formed in each of the plural semiconductor formation areas, having its lengthwise direction along the Y direction.

Figure 4:
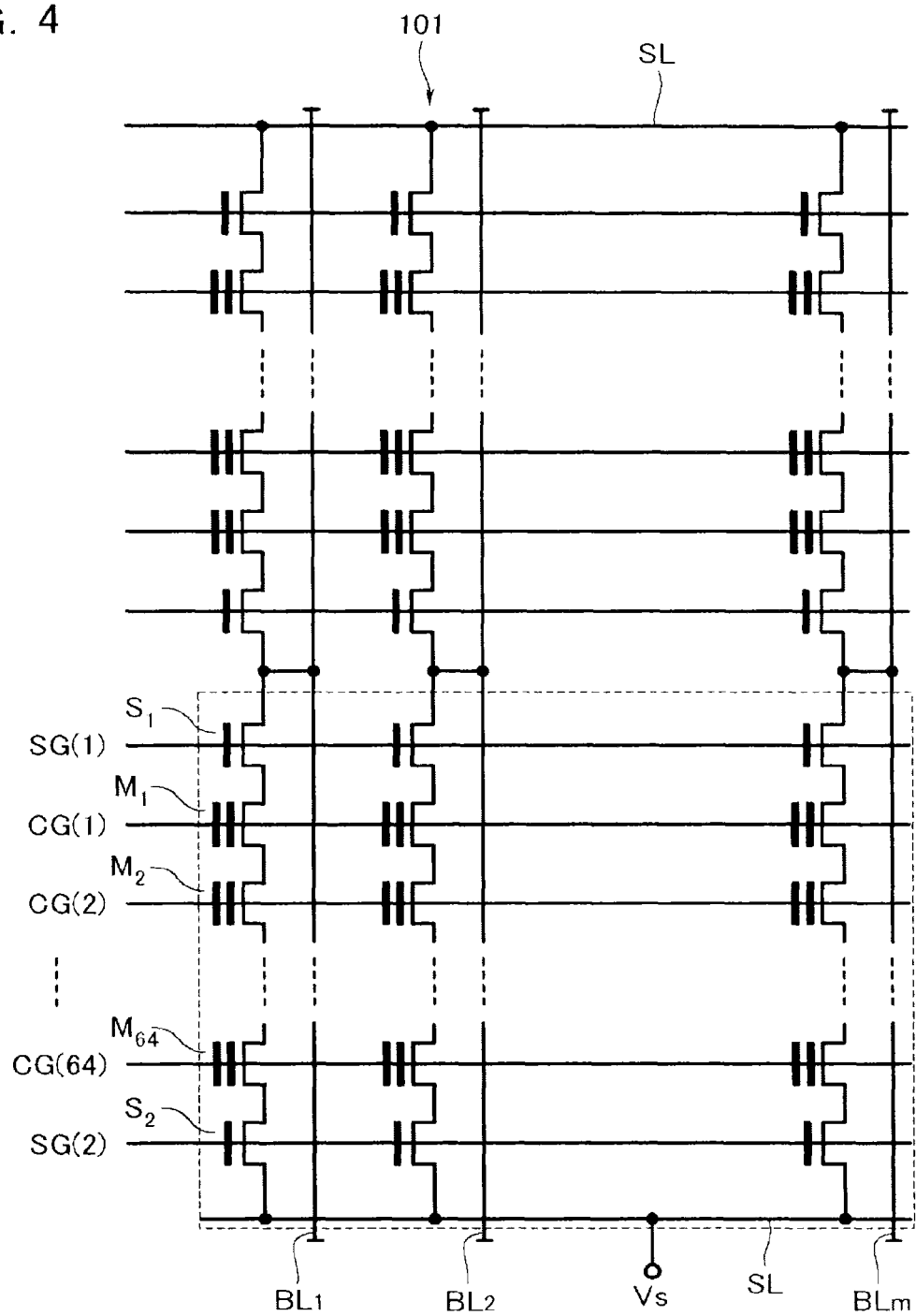
FIG. 4 is an equivalent circuit diagram of the memory cell array 11.

FIG. 4 is an equivalent circuit diagram of the memory cell array 11. The above-described plural NAND cells are arranged along the X direction, and are commonly connected by the word lines WL and the selection gate lines SG (connected to the same word lines WL and the selection gate lines SG) to configure one memory block MB. The memory blocks MB are arranged along the Y direction, and share the plural bit lines BL. In an ordinary read and write operations, only one of the plural memory blocks is selected. In addition, in an erase operation, the memory block MB constitutes a minimum erase unit.

Figure 5:
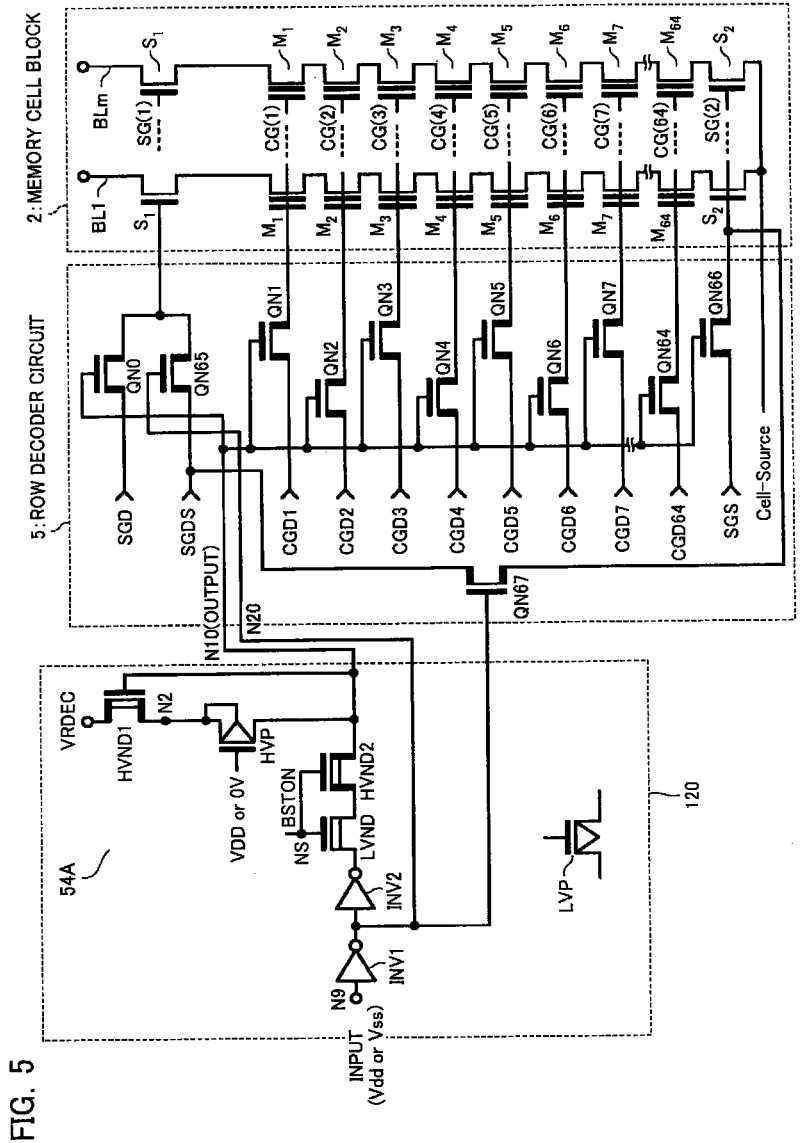
FIG. 5 illustrates a structural example of the row decoder 105.

A structural example of the row decoder 105 is shown in FIG. 5. FIG. 5 shows a case where a row decoder circuit 5 that constitutes the row decoder 105 is arranged on one side of a single memory blocks MB in the memory cell array 101. The row decoder circuit 5 comprises transfer transistors QN0-QN67 (their threshold voltages is Vth(QN)) connected to the control gate lines CG(1) to CG(64) and the selection gate lines SG(1), SG(2). In a circuit of FIG. 5, all of the transistors QN0-QN67 connected to the control gate lines CG(1)-CG(64) and the selection gate lines SG(1), SG(2) are of n channel type.

The transistors QN1-QN64 are respectively connected to the control gate lines CG(1)-CG(64) in one-to-one basis. That is, current paths of the NMOS transistors QN1 to QN64 are connected between the control gate lines CG(1) to CG(64) and signal input nodes CGD1-CGD64, respectively.

Furthermore, current paths of the NMOS transistors QN0 and QN65 are respectively connected between the selection gate lines SG(1) and signal input nodes SGD, SGDS. In addition, current paths of the NMOS transistor QN66 and QN67 are connected between the selection gate line SG(2) and the signal input nodes SGS, SGDS.

Furthermore, a voltage switching circuit 54A is provided for setting gate voltages of the NMOS transistors QN0 to QN67 to change the voltages of the control gate lines CG(1)-(64) and the selection gate lines SG(1) and SG (2). This voltage switching circuit 54A may be constructed as a part of the voltage generating circuit 120.

This voltage switching circuit 54A generates output voltages OUTPUT with different magnitudes, depending on change of an input voltage INPUT and a control signal BSTON, and outputs them to an output node N10. The output voltage OUTPUT that is output to an output node N10 is changed to a value depending on a value of a voltage supplied from a power supply node VRDEC. The output node N10 is connected to a gate of the transistors QN0 to QN64 and QN66. The input voltage INPUT is set to a power supply voltage Vdd when a memory block MB connected to the voltage switching circuit 54A is selected. The input voltage INPUT is set to a reference voltage Vss when it is not selected.

Furthermore, an inverted signal /INPUT of the input voltage INPUT is supplied to a node N20, i.e., gates of the transistors QN65 and QN67.

This allows either the transfer transistor QN0 or QN65 to be turned on n. Similarly, either of the transfer transistors QN66 or QN67 is turned on.

Note that, in FIG. 5, it is also possible that one transfer gate comprising a p channel type MOS transistor and an n channel type MOS transistor connected in parallel is formed for one control gate or one selection gate, instead of forming one n channel MOS transistor QN0 to QN67.

The voltage switching circuit 54A connects a transistor HVND1 and a transistor HVP in serial between the output node N10 and the power supply node VRDEC. The transistor HVND1 has a high withstand voltage, and is of depletion type (D type) N channel MOS transistor. It has a threshold voltage Vth (HVND1) with a negative value. The transistor HVP is an enhancement type (E type) P channel MOS transistor, and has a threshold voltage Vth (HVP) with a negative value. In addition, transistor HVP has a source and a well that are short-circuited to each other.

The transistor HVND1 has a drain connected to the power supply node VRDEC, and a source connected to a source of the transistor HVP at the node N2. Also, the output node N10 is connected to the gate of the transistor HVND1.

The transistor HVND1 needs to have a high withstand voltage because a high voltage may be applied between its source and drain. Accordingly, its gate insulating film is formed with a large thickness. Also, the threshold voltage Vth (HVND1) is set to a negative value (D type) such that when a high voltage (for example, a voltage VpgmH which is a write voltage Vpgm applied to a selected word line in a write operation added by a threshold voltage Vth of the transistors QN0 to QN67 (for example, 22 to 28 V)) is applied to the power source node VRDEC and to its gate.

The transistor HVP has a gate electrode formed of a p type semiconductor (for example, polysilicon). Note that the substrate (N type well) of the transistor HVP is short-circuited to its source. Rendering the transistor HVND1 conductive allows the high voltage VpgmH to be applied to the N type well via the power supply node VRDEC. Also, the power supply voltage Vdd or a ground potential Vss is supplied to its gate.

Furthermore, in this voltage switching circuit 54A, inverter circuits INV1 and INV2, a depletion type N type MOS transistor LVND with a low withstand voltage, and a depletion type n type MOS transistor HNVD2 with a high withstand voltage are connected serially between an input node N9 to which the input voltage INPUT is supplied and the output node N10. The transistor LVND and a transistor HVND2 are applied with a control signal BSTON to their gates, and configure a switching circuit as a whole. The control signal BSTON is a signal which becomes "H" when a certain output voltage is to be supplied to the output node N10.

As described above, the gate electrode of the p type MOS transistor HVP in the voltage switching circuit 54A is configured by a semiconductor doped with p type impurity (for example, boron (B)).

Figure 6A:
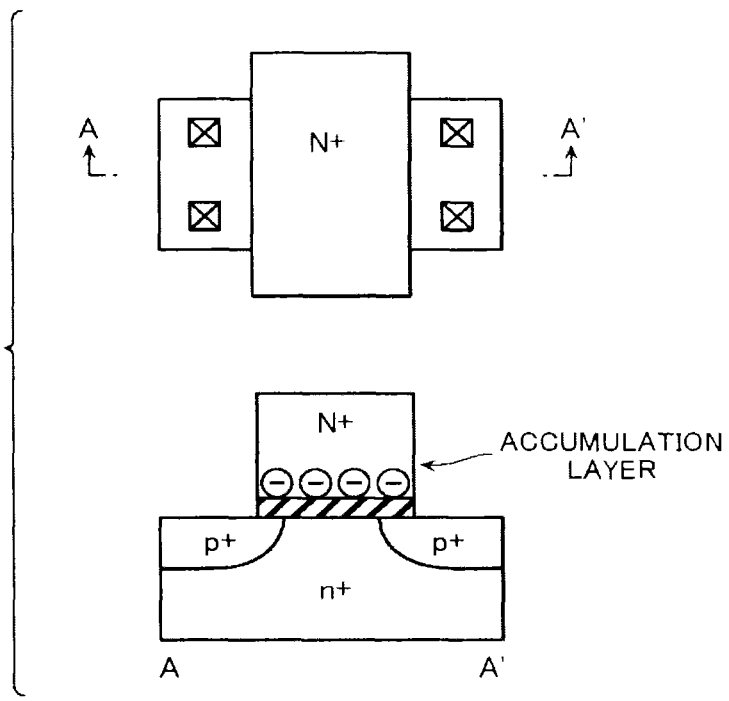
FIG. 6A is a schematic view illustrating an operation of the p type MOS transistor having a gate electrode including an n+ type semiconductor.
Figure 6B:
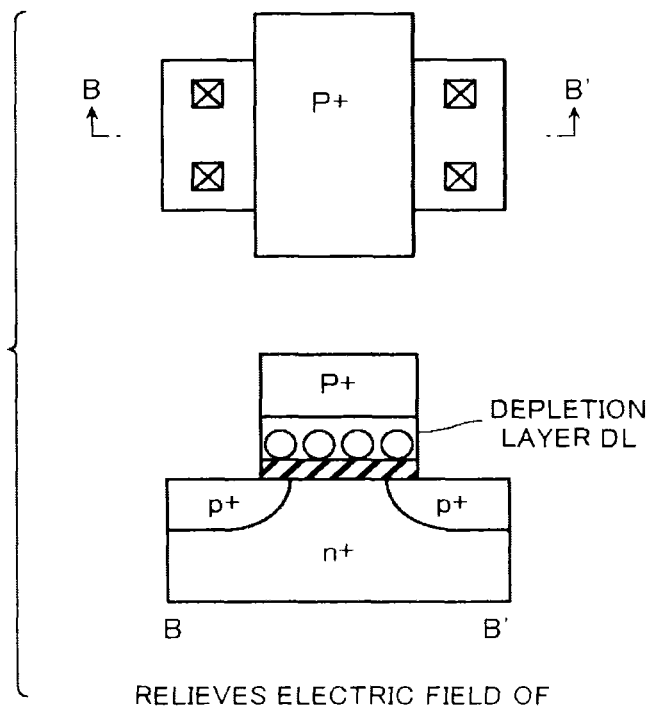
FIG. 6B is a schematic view illustrating an operation of the p type MOS transistor having a gate electrode including p+ type semiconductor.

As shown in FIG. 6A, when the gate electrode of the p type MOS transistor is an n type semiconductor doped with n type impurity, and the gate electrode is applied with a voltage that is smaller than a well voltage, an accumulation layer of electron is formed in the vicinity of the gate insulating film. On the other hand, as shown in FIG. 6B, when the gate electrode of the p type MOS transistor is a p type semiconductor doped with p type impurity, and a voltage supplied to this gate electrode is a voltage that is smaller than the a voltage supplied to the well, holes as carriers move to an upper part of the gate electrode. Thus, a depletion layer DL is formed in a lower part of the gate electrode. This depletion layer DL relieves stress applied to the gate insulating film, and gives an effect similar to thickening the gate insulating film. The p type MOS transistor HVP in the voltage switching circuit 54A also gives an effect shown in FIG. 6B. As an example, when a concentration of p type impurity in the gate of the p type MOS transistor HVP is set to a value of 3.0E19 cm-3 or less, a voltage of around 28 V (for example) is applied to a source and a well of the p type MOS transistor HVP, and a ground potential Vss (0 V) is applied to its gate, a depletion layer with a thickness of approximately around 2 nm is formed below the gate electrode. Accordingly, stress applied to the gate insulating film of the P type MOS transistor HVP is reduced.

Figure 7:
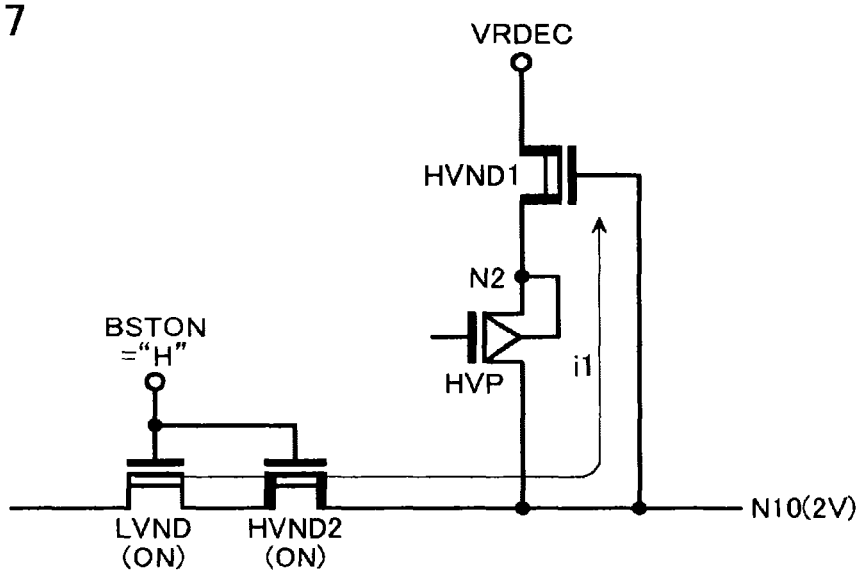
FIGS. 7 and 8 are schematic views illustrating an operation of the voltage switching circuit 54A.

Next, an operation of this voltage switching circuit 54A will be described with reference to FIGS. 7 and 8. Here, a case where the voltage VpgmH is supplied to the output node N10 will be described. However, even when any of other voltages is supplied, its operation is basically the same.

When the voltage VpgmH is supplied to the output node N10, the input voltage INPUT is raised from 0 V to the power supply voltage Vdd (for example, 2V). After that, the control signal BSTON is switched to "H", thereby the transistors LVND and HVND2 being turned on. Due to this, as shown in FIG. 7, a current i1 flows through the transistors LVND and HVND2, thereby charging the output node N10 to the power supply voltage Vdd. Then the control signal BSTON is switched to "L", and the transistors LVND and HVND2 return to a nonconductive state.

Figure 8:
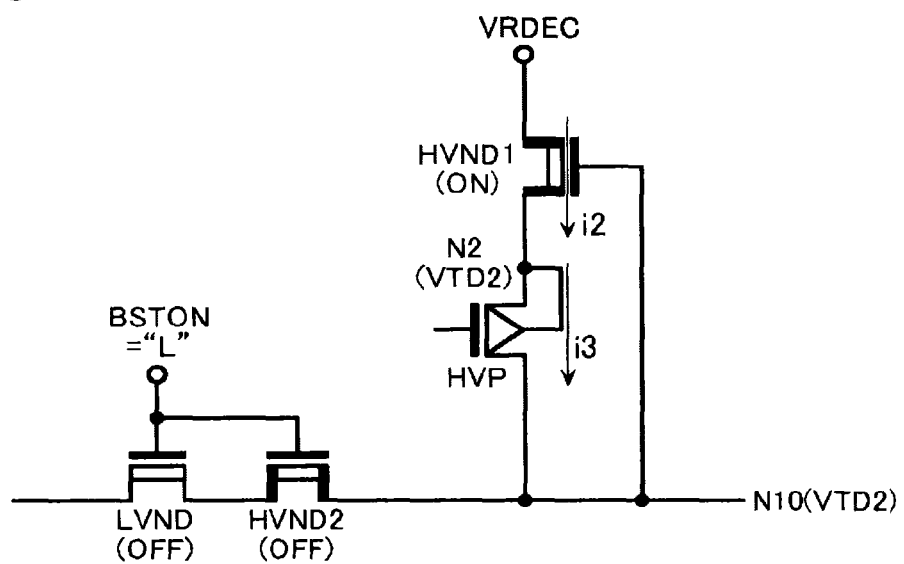

When the output node N10 is charged to the power supply voltage Vdd, transistor HVND1 is turned on as shown in FIG. 8. Due to this, as shown in FIG. 8, a current i2 flows from the power supply node VRDEC to the node N2, and the node N2 is charged to a voltage VTD. Here, the voltage VTD2 needs to have a relationship of, in association with a threshold voltage Vth (HVP) of the transistor HVP, Vth (HVP)>−VTD2.

Also, the transistor HVP is supplied with a ground potential Vss (0 V) at its gate. Accordingly, if the node N2 is charged up to the voltage VTD2, the transistor HVP is also switched to a conductive state. Due to this, a current i3 flows from the node N2 to the output node N10 as shown in FIG. 8, thereby charging the output node N10 up to a voltage VTD2.

Repeating the above-mentioned operation causes a potential of the output node N10 to rise gradually. Finally, it rises up to the voltage VpgmH provided to the power supply node VRDEC. Note that it is also possible that the voltage of the gate of the transistor HVP is set to a ground potential Vss only at the beginning of the operation, and it is switched to the power supply voltage Vdd when the potential of the node N2 rises to a certain value or more.

The transistor HVP is applied with a voltage of around 28 V to its well at the maximum, and its gate voltage is kept at the ground potential (0 V) or the power supply voltage Vdd. Accordingly, a high voltage is applied between its gate and source, and stress to the gate insulating film is large. However, in this embodiment, the gate electrode of the transistor HVP is formed as a p type semiconductor doped with p type impurity, and the concentration of the p type impurity (boron (B)) is set such that a lower part of the gate electrode becomes depleted when a high voltage as described above is applied between its gate and source. Therefore, the depletion layer generated when a high voltage is applied relieves stress of the gate insulating film. This may improve NBTI (Negative Bias Temperature Instability) characteristic of the p type MOS transistor. As an example, the concentration of p type impurity in the gate electrode of the p type MOS transistor HVP is set to 3E19 cm-3 or less.

In this way, the concentration of p type impurity in the gate electrode of the p type MOS transistor HVP is set to a value different from a concentration of p type impurity in the control gate of the memory cell M such that a part of the gate electrode is depleted when a voltage with a certain value is applied between its gate and source. As an example, the former is set to a concentration smaller than that of the latter. For example, the concentration of p type impurity of the control gate 16 of the memory cell M may be set to a value of around 1.0E21 cm-3 when the concentration of p type impurity in the gate electrode of the p type MOS transistor HVP is set to 3.0E19 cm-3. Note that, in addition to difference in concentration of p type impurity, the type of impurity included in the gate electrode of the p type MOS transistor HVP may be different from the type of impurity included in the gate electrode of the control gate 16 of the memory cell M. For example, it is possible that the latter includes carbon (C) and nitrogen (N) as its impurities, the former does not include any of these impurities.

In addition, in this embodiment, another p type MOS transistor LVP than the p type MOS transistor HVP is included in the voltage generating circuit 120 or other peripheral circuit. Moreover, the concentration of p type impurity in the gate electrode of the p type MOS transistor HVP is set to a value such that a part of the gate electrode of the p type MOS transistor HVP is depleted while the gate electrode of the p type MOS transistor LVP is not depleted when a certain voltage is applied between a source and a gate of the p type MOS transistor HVP.

As described above, according to this embodiment, a part of the gate of the p type MOS transistor HVP is depleted when a certain voltage is applied thereto. Accordingly, it is possible to reduce stress to the gate insulating film, and to improve the NBTI characteristic.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a memory cell array having memory cells arranged therein;
    a row decoder circuit that selects a word line in the memory cell array, and transfers a voltage to the word line; and
    a voltage switching circuit that generates an output voltage in response to input of an input voltage, and changes a value of the output voltage depending on a value of a power supply voltage to supply the output voltage to the row decoder,
    the voltage switching circuit comprising:
    an n type MOS transistor having a gate connected to a first terminal that outputs the output voltage, a drain connected to a power supply terminal that outputs the power supply voltage, and a source connected to a second terminal;
    a first p type MOS transistor having a source connected to the second terminal, a drain connected to the first terminal, and a gate provided with a first voltage or a second voltage, a source and a well thereof being short-circuited; and
    a switching circuit connected between a third terminal that supplies the input voltage and the first terminal and configured to turn on when the output voltage is supplied to the first terminal,
    a gate electrode of the first p type MOS transistor being configured by semiconductor including p type impurity, and
    a concentration of p type impurity in a gate electrode of the memory cell being different from a concentration of p type impurity in the gate electrode of the first p type MOS transistor.

2. The nonvolatile semiconductor memory device according to claim 1, wherein
    a concentration of p type impurity in the gate electrode of the first p type MOS transistor is set to a value such that a part of the gate electrode of the first p type MOS transistor is depleted when a certain voltage is supplied between a source and a gate of the first p type MOS transistor.

3. The nonvolatile semiconductor memory device according to claim 1, wherein
    a concentration of p type impurity in the gate electrode of the first p type MOS transistor is 3.0E19 cm-3 or less.

4. The nonvolatile semiconductor memory device according to claim 1, further comprising a second p type MOS transistor different from the first p type MOS transistor,
    wherein a concentration of the p type impurity in the gate electrode of the first p type transistor is set such that when a certain voltage is applied between a source and gate of the first p type MOS transistor, a part of the gate electrode of the first p type MOS transistor is depleted, while the second p type MOS transistor is not depleted.

5. The nonvolatile semiconductor memory device according to claim 1, wherein
    impurity included in the gate electrode of the p type MOS transistor is different from impurity included in the gate electrode of the memory cell.

6. A nonvolatile semiconductor memory device, comprising:
    a memory cell array having memory cells arranged therein;
    a row decoder circuit that selects a word line in the memory cell array, and transfers a voltage to the word line; and
    a voltage switching circuit that generates an output voltage in response to input of an input voltage, and changes a value of the output voltage depending on a value of a power supply voltage to supply the output voltage to the row decoder,
    the voltage switching circuit comprising:
    an n type MOS transistor having a gate connected to a first terminal that outputs the output voltage, a drain connected to a power supply terminal that outputs the power supply voltage, and a source connected to a second terminal;
    a first p type MOS transistor having a source connected to the second terminal, a drain connected to the first terminal, and a gate provided with a first voltage or a second voltage, a source and a well thereof being short-circuited; and
    a switching circuit connected between a third terminal that supplies the input voltage and the first terminal and configured to turn on when the output voltage is supplied to the first terminal,
    a gate electrode of the first p type MOS transistor being configured by semiconductor including p type impurity, and
    a concentration of p type impurity in the gate electrode of the first p type MOS transistor is set to a value such that a part of the gate electrode of the first p type MOS transistor is depleted when a certain voltage is applied between a source and a gate of the first p type MOS transistor.

7. The nonvolatile semiconductor memory device according to claim 6, wherein
    a concentration of p type impurity in the gate electrode of the first p type MOS transistor is 3.0E19 cm-3 or less.

8. The nonvolatile semiconductor memory device according to claim 6, further comprising a second p type MOS transistor different from the first p type MOS transistor,
    wherein a concentration of the p type impurity in the gate electrode of the first p type transistor is set such that when a certain voltage is applied between a source and gate of the first p type MOS transistor, a part of the gate electrode of the first p type MOS transistor is depleted, while the second p type MOS transistor is not depleted.

9. The nonvolatile semiconductor memory device according to claim 6, wherein
    impurity included in the gate electrode of the p type MOS transistor is different from the impurity included in the gate electrode of the memory cell.

* * * * *